(12) United States Patent
Schleuning et al.

(10) Patent No.: US 8,804,781 B2
(45) Date of Patent: Aug. 12, 2014

(54) MACRO CHANNEL WATER-COOLED HEAT-SINK FOR DIODE-LASER BARS

(71) Applicant: Coherent, Inc., Santa Clara, CA (US)

(72) Inventors: David Schleuning, Oakland, CA (US); Athanasios Chryssis, Santa Clara, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 13/662,620

(22) Filed: Oct. 29, 2012

(65) Prior Publication Data

US 2014/0119393 A1    May 1, 2014

(51) Int. Cl.
*H01S 3/04*    (2006.01)

(52) U.S. Cl.
USPC .................................. 372/35; 372/34; 372/36

(58) Field of Classification Search
USPC ............................................................ 372/35
See application file for complete search history.

(56) References Cited

U.S. PATENT DOCUMENTS

| | | | |
|---|---|---|---|
| 4,998,803 A | 3/1991 | Salour et al. | |
| 5,105,429 A * | 4/1992 | Mundinger et al. | 372/34 |
| 5,105,430 A * | 4/1992 | Mundinger et al. | 372/35 |
| 5,107,091 A | 4/1992 | Wagner et al. | |
| 5,181,214 A * | 1/1993 | Berger et al. | 372/34 |
| 5,610,930 A * | 3/1997 | Macomber et al. | 372/36 |
| 5,706,302 A | 1/1998 | Shimizu | |
| 5,715,264 A | 2/1998 | Patel et al. | |
| 5,835,518 A | 11/1998 | Mundinger et al. | |
| 6,265,307 B1 * | 7/2001 | Lou | 438/633 |
| 6,295,307 B1 * | 9/2001 | Hoden et al. | 372/36 |
| 6,895,027 B2 * | 5/2005 | Treusch et al. | 372/36 |
| 7,154,926 B2 | 12/2006 | Kouta et al. | |
| 7,361,978 B2 * | 4/2008 | Stephens | 257/675 |
| 7,502,398 B2 | 3/2009 | Schleuning et al. | |
| 7,567,597 B2 * | 7/2009 | Groetsch | 372/34 |
| 7,656,915 B2 * | 2/2010 | Coleman et al. | 372/35 |
| 7,686,224 B2 | 3/2010 | Schleuning et al. | |
| 7,697,207 B2 | 4/2010 | Govorkov et al. | |
| 7,873,091 B2 * | 1/2011 | Parent et al. | 372/50.12 |
| 8,160,115 B2 | 4/2012 | Schleuning | |
| 8,233,513 B1 | 7/2012 | Schleuning et al. | |

(Continued)

FOREIGN PATENT DOCUMENTS

| | | | |
|---|---|---|---|
| EP | 0973237 | * | 1/1998 |
| EP | 0973237 A1 | | 1/2000 |

(Continued)

OTHER PUBLICATIONS

Notice of Allowance received for U.S. Appl. No. 13/662,841, mailed on Dec. 23, 2013, 14 pages.

(Continued)

*Primary Examiner* — Xinning Niu
*Assistant Examiner* — Vu A Vu
(74) *Attorney, Agent, or Firm* — Morrison & Foerster LLP

(57) ABSTRACT

A diode-laser bar is mounted on water-cooled heat-sink between two ceramic sub-mounts for electrically isolating cooling-water in the heat-sink from the diode-laser bar. Mounting between the two ceramic sub-mounts also provides for balancing stresses due to differences in coefficient of thermal expansion (CTE) between the sub-mounts and the diode-laser bar. Both sub-mounts are in thermal communication with the heat-sink for providing two-sided cooling of the diode-laser bar.

18 Claims, 12 Drawing Sheets

(56) References Cited

U.S. PATENT DOCUMENTS

| | | | |
|---|---|---|---|
| 8,483,249 B1* | 7/2013 | Govorkov et al. | 372/35 |
| 2004/0165628 A1* | 8/2004 | Rice | 372/36 |
| 2005/0069266 A1* | 3/2005 | Kouta et al. | 385/92 |
| 2008/0069160 A1* | 3/2008 | Stephens | 372/35 |
| 2009/0092162 A1* | 4/2009 | Huff et al. | 372/36 |
| 2011/0182309 A1* | 7/2011 | Deri et al. | 372/36 |
| 2012/0252144 A1 | 10/2012 | Schroeder et al. | |

FOREIGN PATENT DOCUMENTS

| | | | |
|---|---|---|---|
| EP | 1271723 | A2 | 1/2003 |
| EP | 1271723 | A3 | 2/2005 |
| JP | 2004-235567 | A | 8/2004 |
| JP | 2012-89584 | A | 5/2012 |

OTHER PUBLICATIONS

International Search Report and Written Opinion received for PCT Patent Application No. PCT/US2013/066711, mailed on Feb. 17, 2014, 13 pages.

International Search Report and Written Opinion received for PCT Patent Application No. PCT/US2013/066712, mailed on Feb. 17, 2014, 15 pages.

* cited by examiner

MACRO CHANNEL WATER-COOLED HEAT-SINK FOR DIODE-LASER BARS

TECHNICAL FIELD OF THE INVENTION

The present invention relates in general to diode-laser bar packaging. The invention relates in particular to packaging diode-laser bars on a water-cooled heat-sink.

DISCUSSION OF BACKGROUND ART

The term "packaging" applied to diode-laser bars refers to mounting a diode-laser bar, or an array of diode-laser bars, on some sort of cooling-base or heat-sink. This base may be a relatively massive base providing a "conductively cooled package" (CCP). For higher power operation, the base is typically water-cooled, for example by a micro-channel arrangement.

A diode-laser bar includes a plurality of semiconductor layers epitaxially grown on a single-crystal substrate, with a plurality of diode-laser emitters defined in the epitaxial layers. Typically, the substrate is an n-type substrate, and layers are grown such that layers forming the "p-side" (anode-side) of the diodes are uppermost. The diode-laser bar is soldered "p-side down" either directly onto the heat-sink or via a sub-mount having a coefficient of thermal expansion (CTE) intermediate that of the substrate material and the heat-sink material, which is usually copper.

Electrical connection to the diode-laser bars places the heat-sink and cooling-water therein, in electrical contract with the diode-laser bar energizing circuit. In an array of diode-laser bars, the water can short-circuit electric connection to the bars, unless the electrical conductivity of the water is low. A common solution to this is to use de-ionized (DI) or high-resistance water. However, DI water is more corrosive on metals than water from conventional building supplies, and the use of DI water is expensive and inconvenient by comparison.

In micro-channel cooled arrangements, cooling-channels generally have internal dimensions of about 0.5 millimeters (mm) or less with water forced through the channels by high pressure at relatively high velocities. This also can lead to rapid corrosion of the copper in which the water cooling-channels are formed. This corrosion can be somewhat mitigated by plating the water cooling-channels with a metal such as gold. However, since the micro-channels are "internal" to the heat-sink the plating can only be achieved by immersion-plating usually using forced-flow plating-solutions. This results in uneven plating, with the internal nature of the channels preventing non-destructive inspection for quality assurance. There is a need for an improved water-cooled heat-sink for diode-laser bars, that will facilitate, or eliminate a need for, plating of cooling-channels, and that does not require the use of de-ionized water.

SUMMARY OF THE INVENTION

The present invention is directed to methods and apparatus for cooling one or more diode-laser bars during operation. In one aspect, diode-laser apparatus in accordance with the present invention comprises a heat-sink including first and second cooling-members spaced apart, facing each other, and in thermal communication with the heat-sink. First and second thermally conductive, electrically insulating, sub-mounts of a ceramic material are provided, each thereof having first and second opposite surfaces. A diode-laser bar assembly is located between the first and second cooling-members. The diode-laser bar assembly includes a diode-laser bar solder-bonded between the first surfaces of the first and second sub-mounts, with the second surfaces of the first and second sub-mounts in thermal communication with respectively the first and second cooling-members.

In an embodiment of the present invention wherein the diode-laser bar is one of a stack of diode-laser bar assemblies mounted on the heat-sink and the heat sink is water-cooled, this diode-laser bar assembly and mounting arrangement provides for electrically isolating the cooling-water from the diode-laser bars. This eliminates the need for using de-ionized or high-resistance water for cooling. Other advantages and embodiments of the present invention will be evident to one skilled in the art from the detailed description of the invention set forth below.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
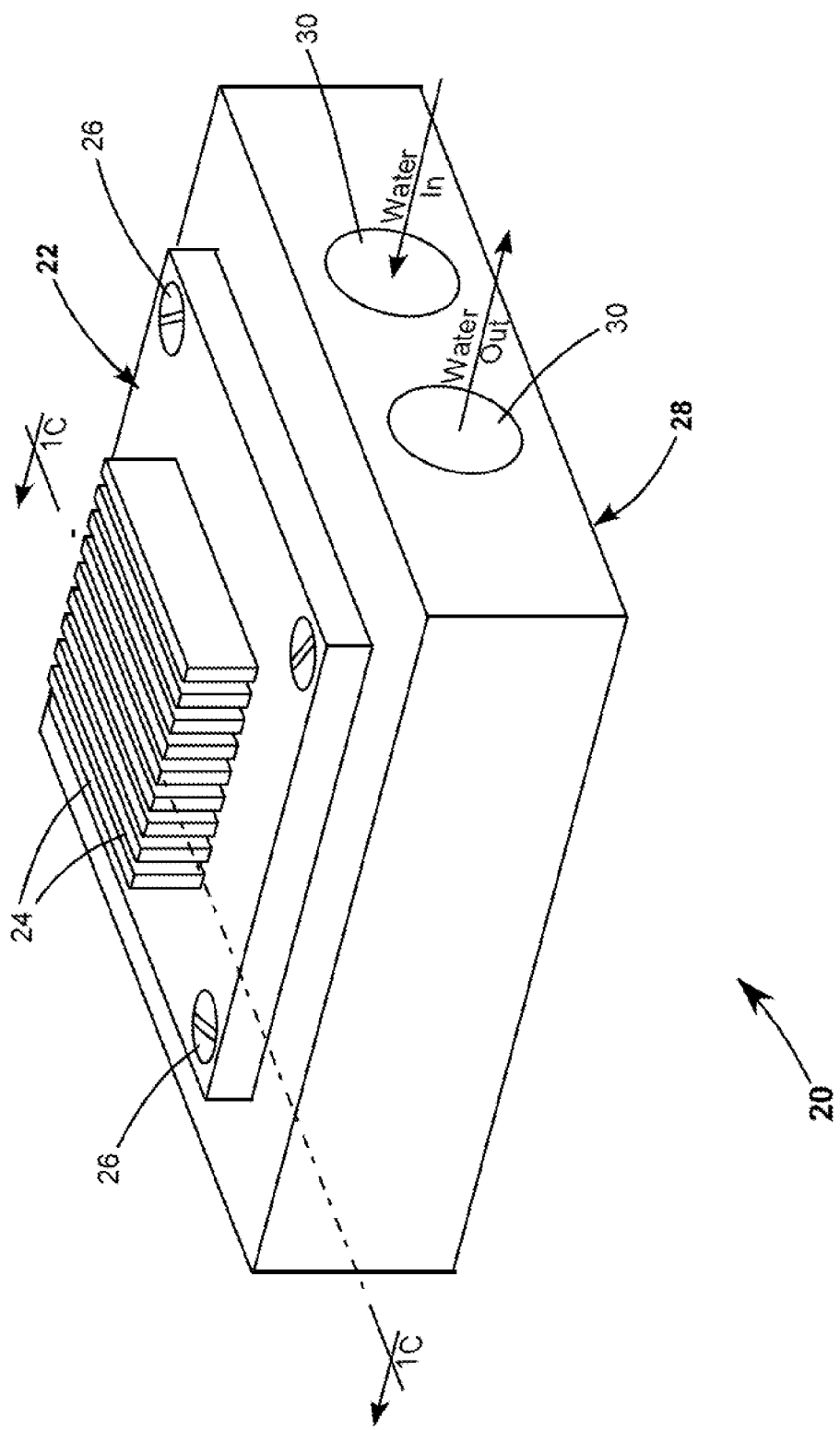
FIG. 1 is a three dimensional view that schematically illustrates a water-cooled heat-sink for a diode-laser bar stack in accordance with the present invention including a copper cooling-unit having an integral array of cooling-members, spaced apart and parallel to each other, with the cooling-unit attached to a steel base with conduits for introducing cooling-water into and out of the heat-sink.

Referring now to the drawings, wherein like components are designated by like reference numerals, FIG. 1 schematically illustrates a water-cooled heat-sink 20 for a diode-laser bar stack in accordance with the present invention. Heat-sink 20 includes a copper cooling-unit 22 including elongated rectangular cooling-members (mounting-members) 24 spaced apart and parallel to each other, extending upward from the cooling-unit in a width-direction of the cooling-members, as illustrated. Diode-laser bars, not shown in this view, are mounted between the cooling-members. Preferably, the cooling-members 24 are an integral part of cooling-unit 22, i.e., the cooling-unit including the cooling-members is machined from a single piece of copper. Cooling-unit 22 is attached by screws 26 to a base 28 including conduits 30 for introducing cooling-water into and out of the heat-sink. The choice of which conduit is an input conduit and which conduit is an output conduit, here, is somewhat arbitrary. Base 28 is preferably made from a material which is easily machined. One preferred material is stainless steel.

In operation of heat-sink 20, cooling-water flows into base 28 through a selected one of conduits 30, through each of cooling-members 24 (in parallel) in cooling-unit 22 and out of the other conduit 30. A description of a preferred arrangement for this cooling-water flow is set forth below with reference to FIG. 1A, FIG. 1B, and FIG. 1C. Fittings or coupling units for connecting to conduits 30 to supply water and disposal hoses or tubes are not shown for simplicity of illustration. Such fittings can be selected from several well-known and commercially available fittings.

Figure 1A:
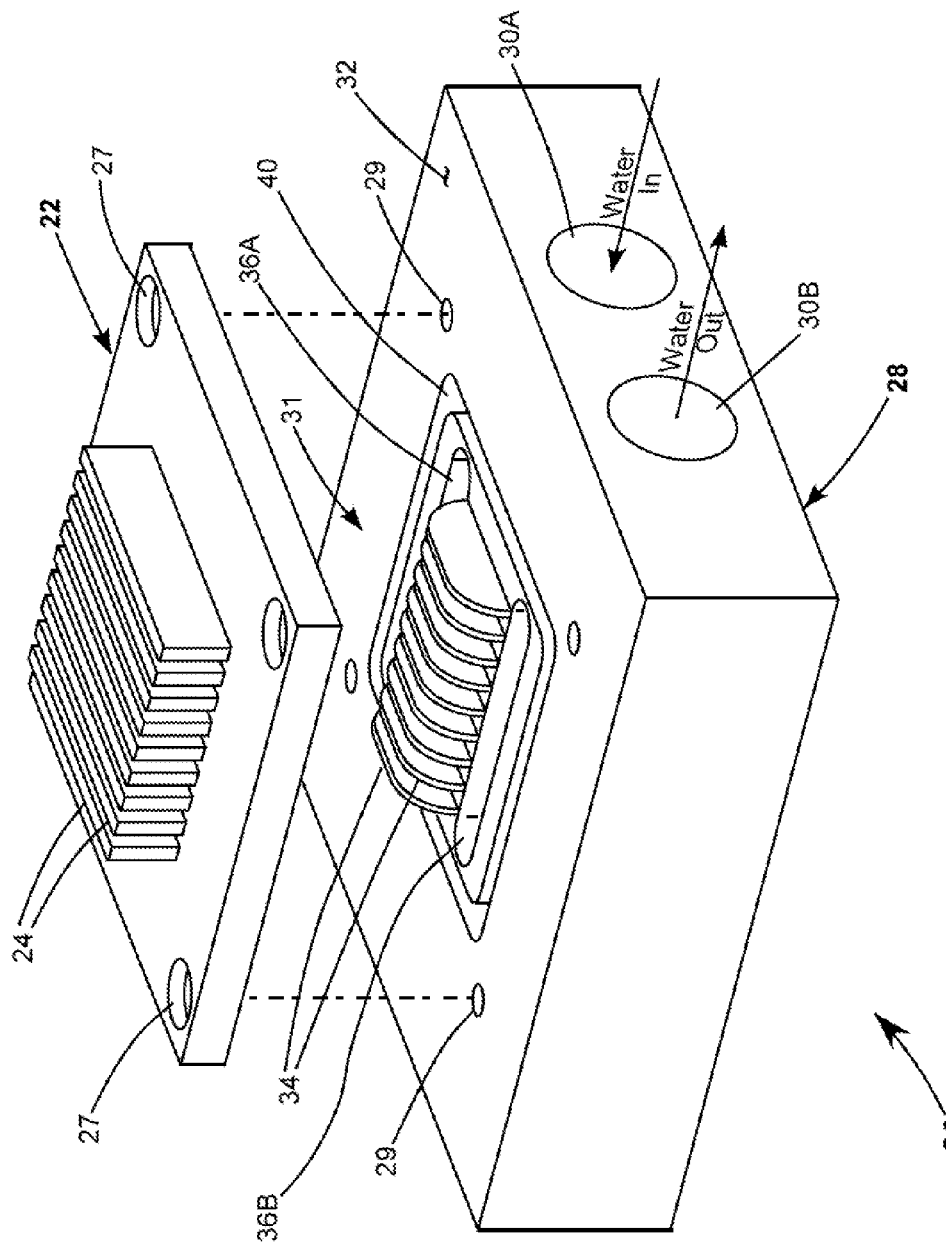
FIG. 1A is an exploded view from above of the heat-sink of FIG. 1 schematically illustrating an integral manifold arrangement in the steel base cooperative with the conduits of FIG. 1, and cooperative with an integral array of fins cooperative with the array of cooling-members in the copper cooling-unit for flowing water through the cooling-members.

FIG. 1A is an exploded view from above of heat-sink 20 of FIG. 1 schematically illustrating an integral manifold arrangement 31 in the base 28 cooperative with conduits 30, and cooperative with cooling-members 24 in cooling-unit 22. Manifold 31 includes elongated plenums 36 machined into surface 32 of base 28. Here, the input plenum is designated as plenum 36A and the output plenum is designated as plenum 36B, corresponding to the designation of the input and output conduits with which the plenums connect. Screws 26 for attaching unit 22 to base 28 are not shown in this view. The screws extend through holes 27, here countersunk, in unit 22, and are received by threaded holes 29 in base 28.

Between plenums 36A and 36B is an array of boat-shaped fins 34 (fins with quarter-rounded ends). The fins are spaced apart and parallel to each other with a center-to-center spacing equal to the center-to-center spacing of cooling-members 24 in unit 22. Surrounding the manifold arrangement of plenums and fins is a trench or groove 40 configured for accommodating a water-seal (not shown in this view) such as an elastomer ring or the like. It is preferable that the base, including plenums, fins, and the water-seal groove are machined from a single piece of material.

Figure 1B:
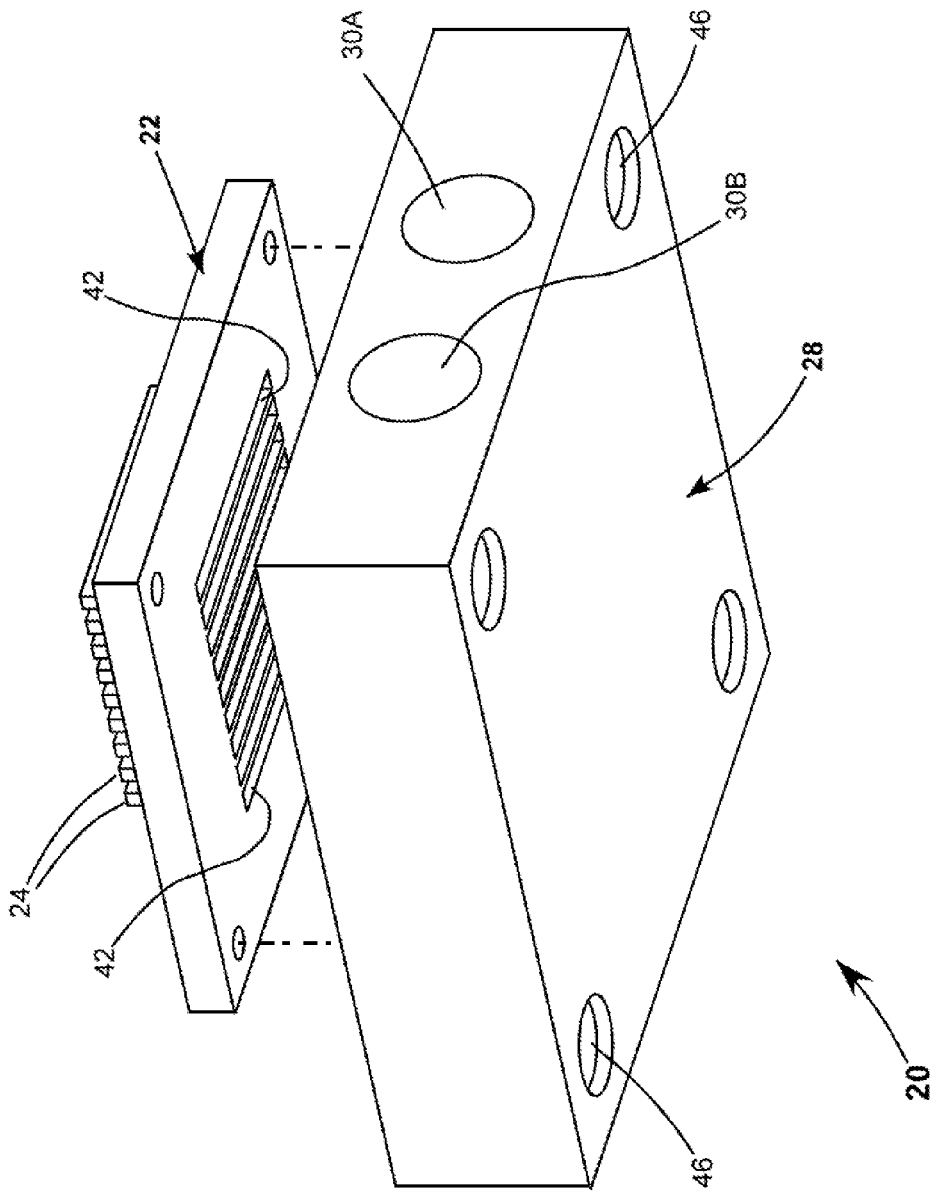
FIG. 1B is an exploded view from below of the heat-sink of FIG. 1 schematically illustrating a plurality of slots extending into the cooling-members of the cooling-unit, the slots being equal in number and spacing to the number and spacing of the cooling-members.

FIG. 1B is an exploded view from below schematically depicting slots 42 extending into cooling-members 24 of cooling-unit 22. Also depicted are threaded holes 46 in base 28. These are provided for attaching the heat-sink unit to a base, walls, or a support structure of a housing in which the inventive heat-sink will be used.

Figure 1C:
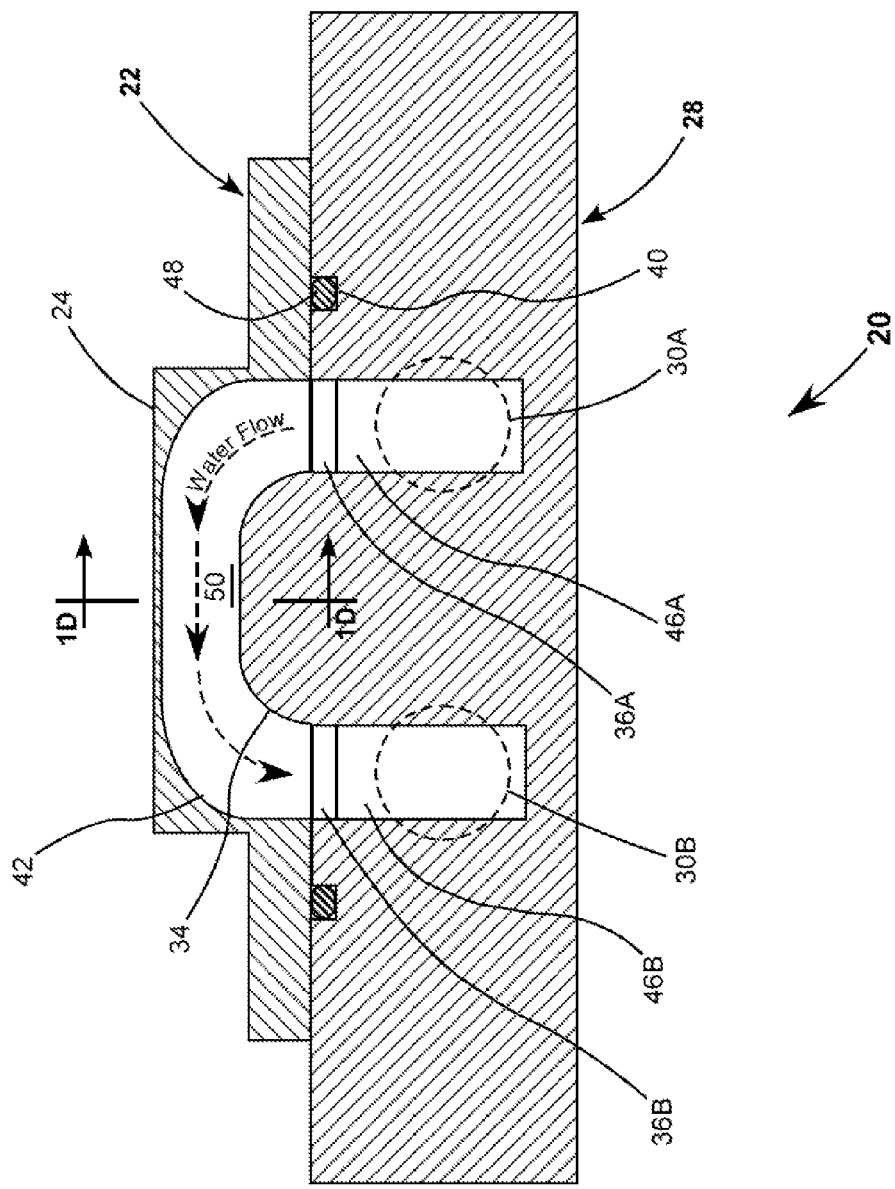
FIG. 1C is a cross-section view seen generally in the direction 1C-1C of FIG. 1, schematically depicting a longitudinal aspect of a cooling macro-channel formed by insertion of a fin of the base of FIG. 1A in a slot of the cooling-unit of FIG. 1B.

FIG. 1C is a cross-section view seen generally in the direction 1C-1C of FIG. 1. This view depicts a longitudinal aspect of slots 42 in unit 22. Here, the slots have a bathtub-like longitudinal shape, cooperative with the boat-shape of fins 34 such that, when each fin is inserted into a corresponding slot, a macro-channel 50, having a height H, is formed in each cooling-member 24. Height H, of course results from a difference in the depth of the slot and the height of the fin being less than the depth of the slot).

Figure 1D:
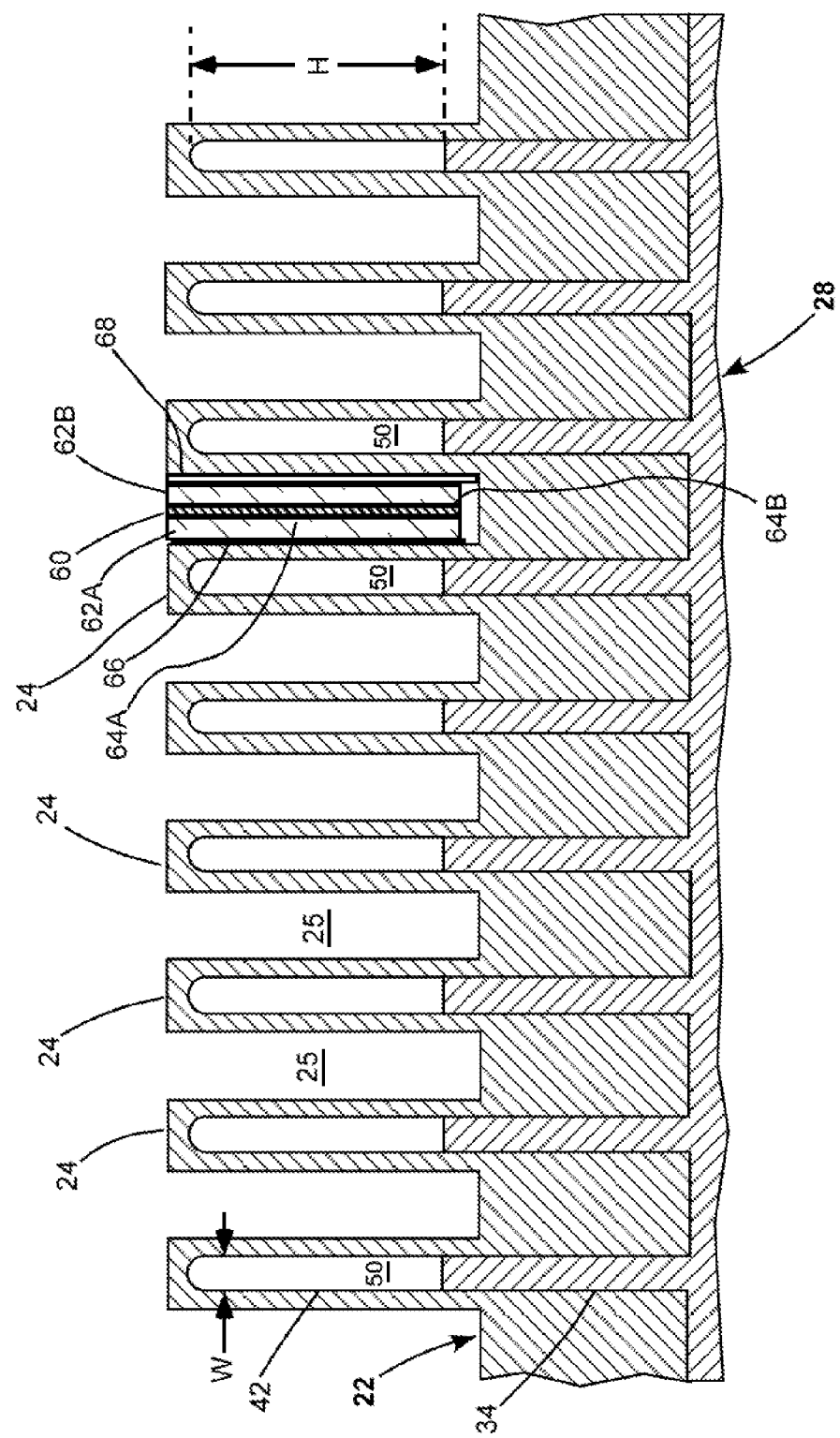
FIG. 1D is a cross-section view seen generally in the direction 1D-1D of FIG. 1C schematically depicting a lateral aspect of the cooling-member of the cooling-unit, macro-channels therein, and a diode-laser bar bonded between two ceramic sub-mounts between adjacent ones of the sub-members, with one of the sub-mounts bonded to one of the adjacent ones of the cooling-members.

Macro-channel 50 has rounded corners resulting from the longitudinal shape selection of the fins and slots. The ends of channel 50 align with plenums 36A and 36B in base 28. The plenums are in fluid communication with conduits 30 via ducts 46A and 46B in base 28. FIG. 1D is a cross-section view seen generally in the direction 1D-1D of FIG. 1C schematically depicting a lateral aspect of cooling-members 24 of cooling-unit 22 with macro-channels 50 having a width W.

A particular advantage of this inventive, two-piece construction for providing cooling macro-channels 50 is that surfaces that form the channels can be plated, for example gold-plated, by conventional electroplating methods. The plating can be inspected before heat-sink 22 is assembled. Preferably, at least those surfaces provided by copper cooling-unit 22 should be plated. Surfaces of the channels provided by base 28 may be plated if the selected base material is not inherently corrosion resistant.

Regarding dimensions of macro-channels 50, for a cooling-member 24 having a width of about 1.0 mm, each macro-channel preferably has a height H of between about 3.7 mm and about 4.0 mm, and a width W of about 0.5 mm. These dimensions are provided for guidance only and should not be considered limiting.

The shape of the rounded corners of the macro-channels is not critical, but is provided to ensure that there is free flow of cooling-water as depicted, avoiding any sharp corners or recesses in which water could be trapped. Suitable channel-dimensions and corner-shape can be readily determined, by trial and error, for any predetermined range of pressure difference between inlet and outlet, using commercially available thermal-analysis software such as SolidWorks, from Dassault Systèmes of Vélizy-Villacoublay, France. The channel-width should bring cooling-water close enough to the surface of the cooling-members to optimize cooling while still leaving the cooling-member sufficiently rigid to support bonding operations for diode-laser bars.

Continuing with reference to FIG. 1D, a lateral aspect of a particularly preferred mounting scheme in accordance with the present invention for a diode-laser bar in a space 25 between adjacent cooling-members 24 is depicted. Here, a diode-laser bar 60 is solder-bonded between metallized surfaces 64A and 64B of two ceramic (insulating) sub-mounts 62A and 62B. The ceramic material of the sub-mounts is preferably relatively highly thermally conductive.

Another factor influencing the choice of ceramic material is the CTE, which should be compatible with substrate material of the diode-laser bar, the solder used for the bonding and the diode-laser bar substrate material. For gallium arsenide (GaAs) substrates, suitable ceramic materials include beryllium oxide (BeO) and aluminum nitride (AlN).

These materials permit that a hard solder such as gold/tin (Au/Sn) solder can be used to bond the diode-laser bar to the sub-mount without inducing intolerable stress on the diode-laser bar due to thermal cycling (on and off operation) during normal use. One advantage of bonding the diode-laser bar between two ceramic sub-mounts is that whatever stress is produced is balanced, thereby minimizing distortion of the diode-laser bar and alignment of emitters thereof. Slow axis misalignment of emitters in a diode-laser bar is whimsically termed 'smile" by practitioners of the art.

One of the sub-mounts, between which diode-laser bar 60 is bonded, has a metallized surface 66 solder-bonded to one of the cooling-members. In FIG. 1D sub-mount 62A is bonded to the cooling-member. Preferably a thermally conductive packing 68, such as a shim or plated solder material, is inserted between the "un-bonded" sub-mount (here, sub-mount 62B) and the cooling-member to put the sub-mount in thermal communication with a cooling-member. Clearly, a better thermal communication is established between the bonded sub-mount and the cooling-member to which it is bonded. Accordingly, it is preferable that the epitaxial-layers side (p-side or anode-side) of the diode-layer bar is bonded to the "bonded sub-mount". However, with a sufficiently thin sub-mount, for example less than about 0.4 mm thick, and the inclusion of shim 68, there is still effective cooling of the n-side of the epitaxial layers of the diode-laser bar.

Figure 2:
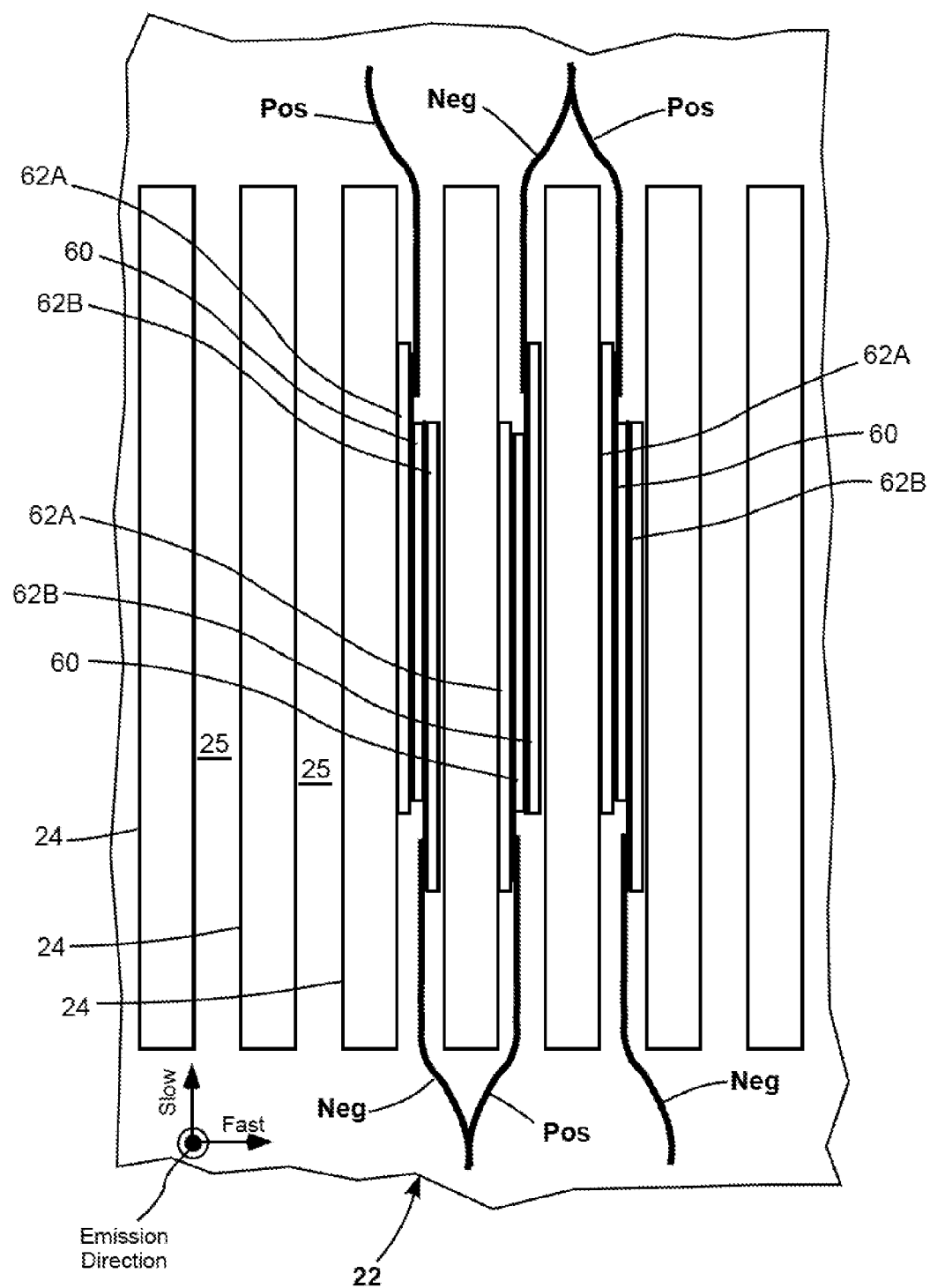
FIG. 2 is a fragmentary plan view from above of the cooling-unit of FIG. 1 schematically illustrating three diode-laser bars mounted between ceramic sub-mounts, mounted in-turn between cooling-members of the cooling-unit, with the diode-laser bars connected electrically in series.

FIG. 2 is a fragmentary plan view from above of the cooling-unit of FIG. 1 schematically illustrating three diode-laser bars mounted between ceramic sub-mounts mounted in-turn between cooling-members of the cooling-unit as discussed above with reference to FIG. 1D. It should be noted in particular that the cooling-members are sufficiently long that the entire length of a diode-laser bar can be in communication with the straight portion (between rounded corners) of the cooling-channels in the cooling-members.

Further, ceramic sub-mounts 62A and 62B are sufficiently long to permit a partial overlap of a length equal to or greater than the length of the diode-laser bar. The partial overlapping is done with the non-overlapped portions of the sub-mounts at opposite ends of the diode-laser bar, and in this instance, the overlapping is sequentially alternated between adjacent pairs of sub-mounts.

This alternate partial overlapping arrangement of the metallized sub-mounts permits convenient connection of the diode-laser bars in series. In this arrangement, reading from left to right, a positive (Pos) lead is connected to the non-overlapped part of sub-mount 62A at one end of diode-laser bar 60 and a negative (Neg) lead is connected to the non-overlapped part of sub-mount 62B at the other end of the diode-laser bar. The negative lead from sub-mount 62A is connected to a positive lead attached to sub-mount 62A of the next-diode-laser bar, and so on.

The connecting leads (sheet or strip electrodes) are made sufficiently rigid that the shape of the electrodes is retained in normal use, and cannot accidentally come into contact with an exposed part of a cooling-member. Because of this, and because of there being an electrically insulating sub-mount on each side of the diode-laser bars, cooling-water in the heat-sink is electrically isolated from the diode-laser bars.

For convenience of illustration, optical axes (well-known fast- and slow-axes) of the diode-laser bars are shown inset in FIG. 2. The emission direction of the emitters of the diode-laser bars is as indicated, i.e., perpendicular to the plane of the drawing, in the extension-direction of the cooling members. A plurality of diode-laser bars arranged in this manner is typically referred to as a vertical-stack or fast-axis stack of diode-laser bars.

Exemplary dimensions in the arrangement of FIG. 2 are as follows. The length of cooling-members 24 is about 20 mm; the thickness of the cooling-members is about 1 mm; the width ("thickness") of spaces 25 between the cooling-members is about 1 mm. Here again, these dimensions are provided for guidance only, and should not be considered as limiting the present invention.

Figure 3:
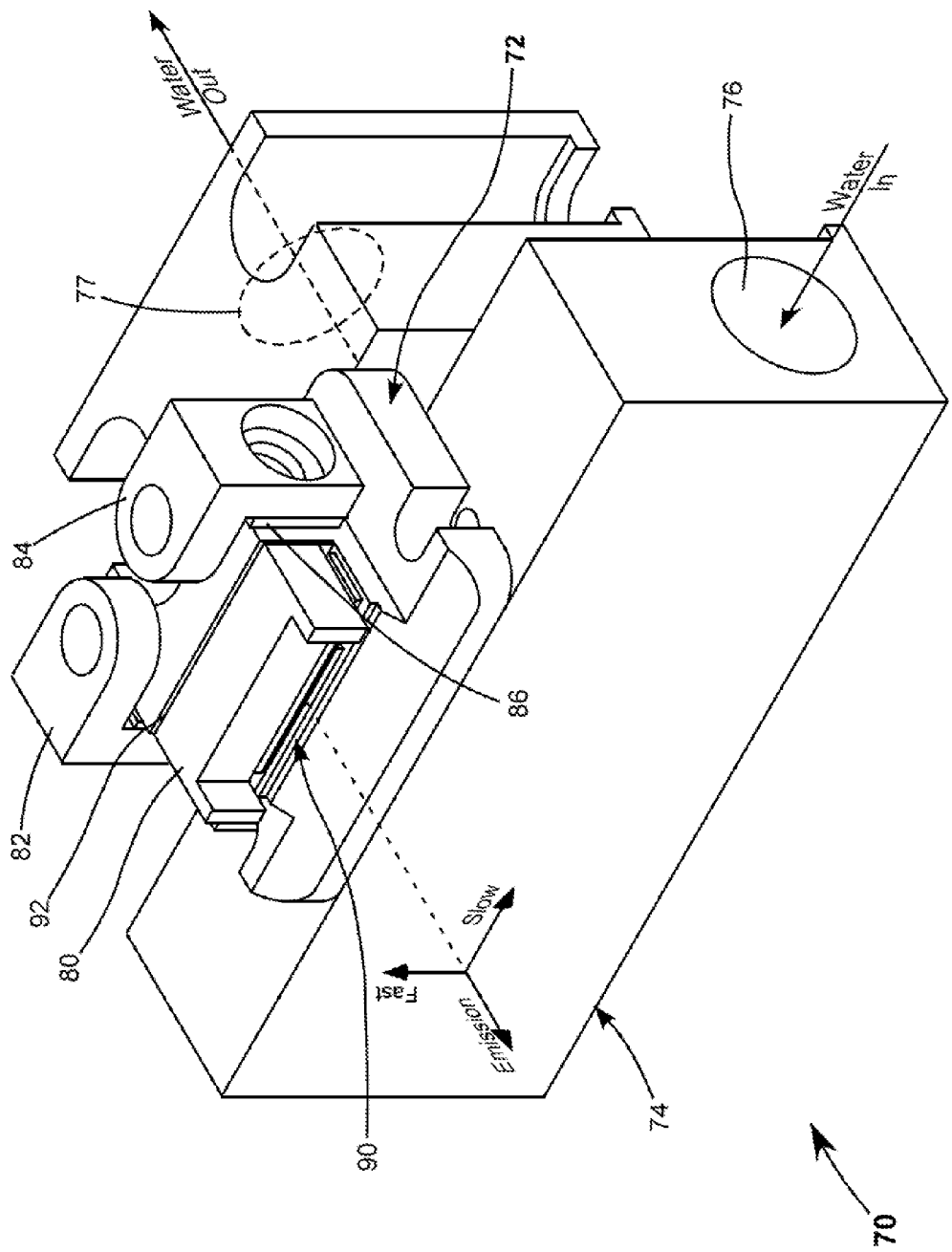
FIG. 3 is a three-dimensional view, schematically illustrating a preferred embodiment of a water-cooled heat-sink in accordance with the present invention for a diode-laser bar, the heat-sink including a copper cooling-unit on which the diode-laser bar is mounted, the copper cooling-unit being attached to a steel base with conduits for introducing cooling-water into and out of the heat-sink, with the base and cooling-unit being configured such that, when assembled together, a plurality of spaced-apart parallel macro-channels if formed through which water flows for cooling the cooling-unit.

Principles of the invention described above in the context of cooling a fast-axis stack of diode-laser bars are equally applicable to cooling a single diode-laser bar. By way of example, FIG. 3 schematically illustrates a preferred embodiment of a diode-laser bar package 70 including water-cooled heat-sink in accordance with the present invention. The diode-laser bar is in a "sandwich" 90 between metallized, ceramic, electrically insulating sub-mounts as described above for the inventive fast-axis stack arrangement. The diode-laser bar axes are shown inset in FIG. 3. The heat-sink of package 70 includes a copper cooling-unit 72 on which the diode-laser bar sandwich is mounted. The copper cooling-unit is attached to a steel base 74 with a conduit 76 for introducing water into the package and a conduit 77 for delivering water from the package. Details of the conduit arrangements (not shown) within base 74 and cooling-channels or macro-channels (also not shown) are discussed in detail further hereinbelow.

Figure 3A:
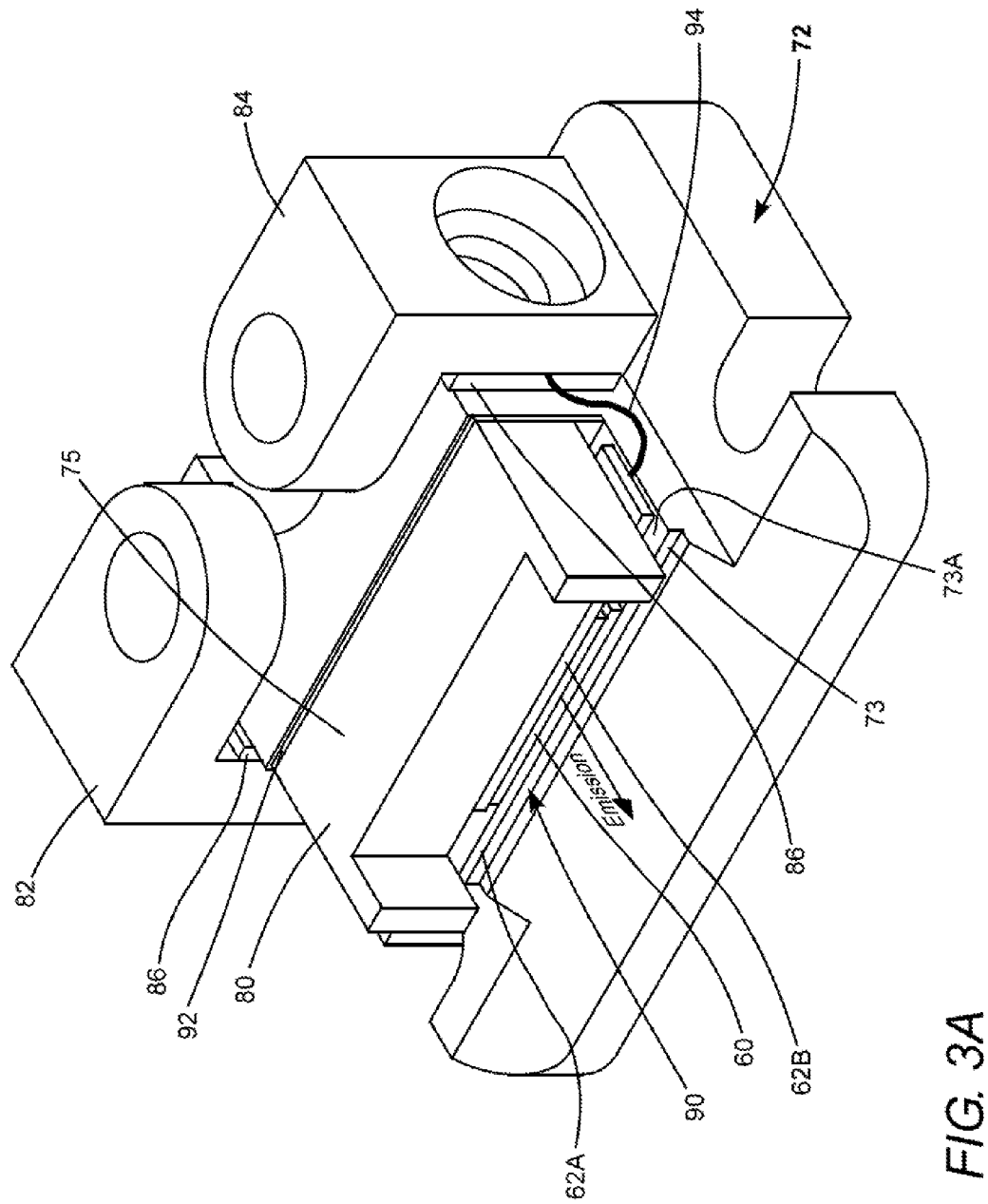
FIG. 3A is an enlarged three-dimensional view schematically illustrating details of the cooling-unit of FIG. 3 including the diode-laser bar sandwiched between ceramic (insulating) sub-mounts in the manner depicted in FIG. 2.
Figure 3B:
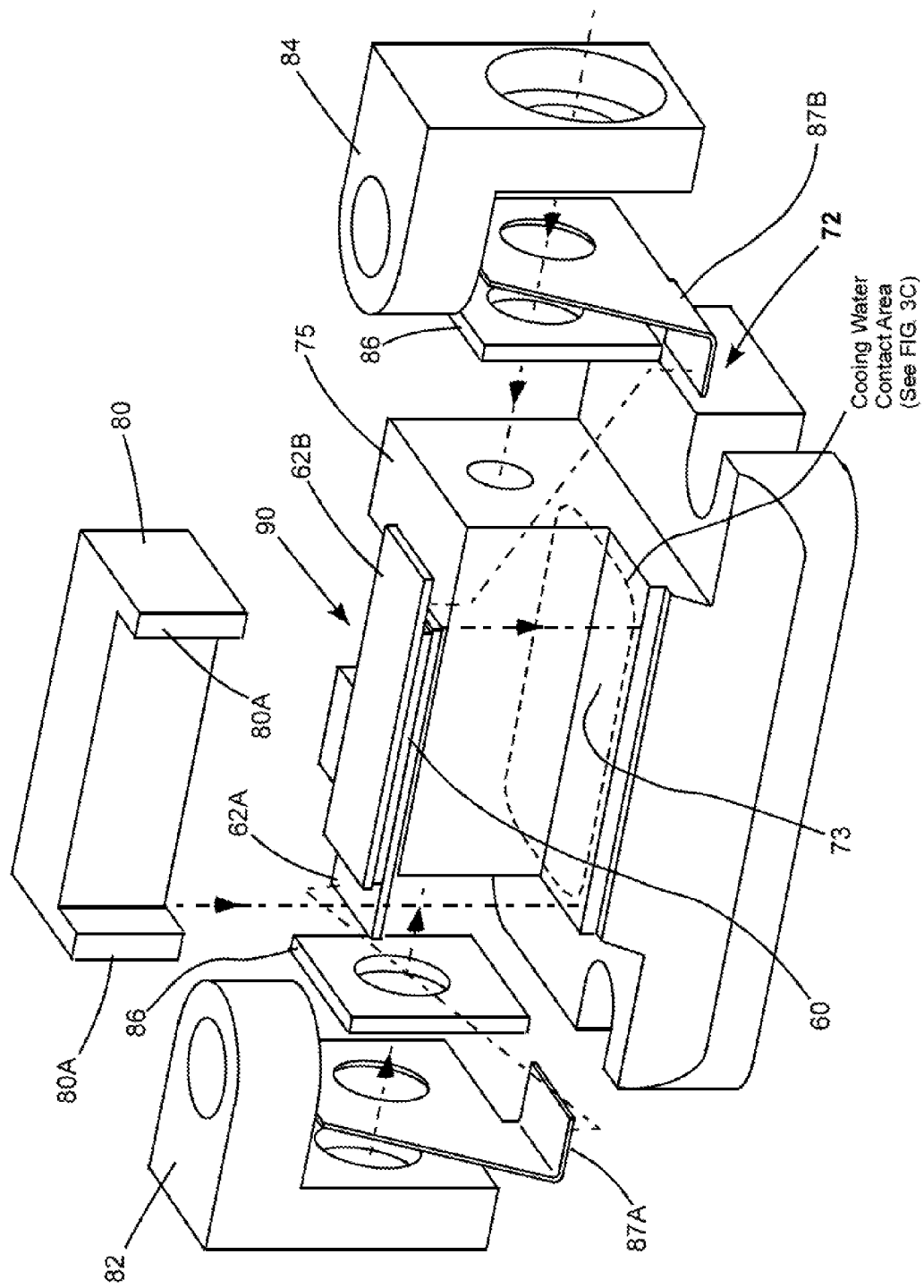
FIG. 3B is an exploded enlarged three-dimensional view schematically illustrating further details of the cooling-unit of FIG. 3 including components for isolating cooling-water from electrical connections to the diode-laser bar.

Continuing with reference to FIG. 3, and with reference in addition to FIG. 3A, and FIG. 3B, diode-laser bar sandwich 90, comprising diode-laser bar 60 bonded between ceramic sub-mounts 62A and 62B is bonded to cooling-unit in the form of an integral mounting-platform 73 of cooling-unit 72. The emission direction of the diode-laser bar is parallel to surface 73A of the mounting platform.

The diode-laser bar is bonded epitaxial-side (p-side or anode-side) down on sub-mount 62A, which is the sub-mount in contact with platform 73. A separate cathode-side cooling-block (cooling-unit) 80 is bonded to ceramic sub-mount 62B. A thermally conductive packing or shim 92 of solder material, such as indium (In) or the like, places cathode-side cooling-block in thermal communication with a raised portion 75 of the cooling-unit (see FIG. 3A). Extended end-portions 80A (see FIG. 3B) of the cathode-side cooling-block are provided for mounting collimating optics (not shown) for the diode-laser bar. Cooling-water flows in contact with platform 73 and part of raised portion 75 as outlined in phantom in FIG. 3B.

Terminal blocks 82 and 84 (anode and cathode respectively) are attached to raised portion 75 of cooling-unit by screws and insulating bushings (not shown), with insulating pads 86 placed between the blocks and the raised portion of the cooling-unit. This is important in preventing any electrical contract between the terminal blocks and the cooling-unit.

Electrical contact with the diode-laser is made from electrical leads clamped at one end thereof between terminal blocks 82 and 84 and corresponding insulators 86, and bonded the opposite end thereof to the (metallized) diode-laser sides of ceramic sub-mounts 62A and 62B. In FIG. 3A, a cathode lead is depicted symbolically as a wire-lead 94. In practice, this is a sheet electrode (for current carrying capacity) but is not depicted as such in FIG. 3A to avoid obscuring other details of the heat-sink-assembly. In FIG. 3B, examples 87A and 87B of such sheet-electrodes are depicted. Dashed lines indicate the connection of electrodes 87A and 87B to sub-mounts 62A and 62B, respectively. Here again, this method of electrical connection to the diode-laser by metallized sides of the ceramic sub-mounts is for avoiding any electrical contact between the diode-laser bar and the heat-sink.

Figure 3C:
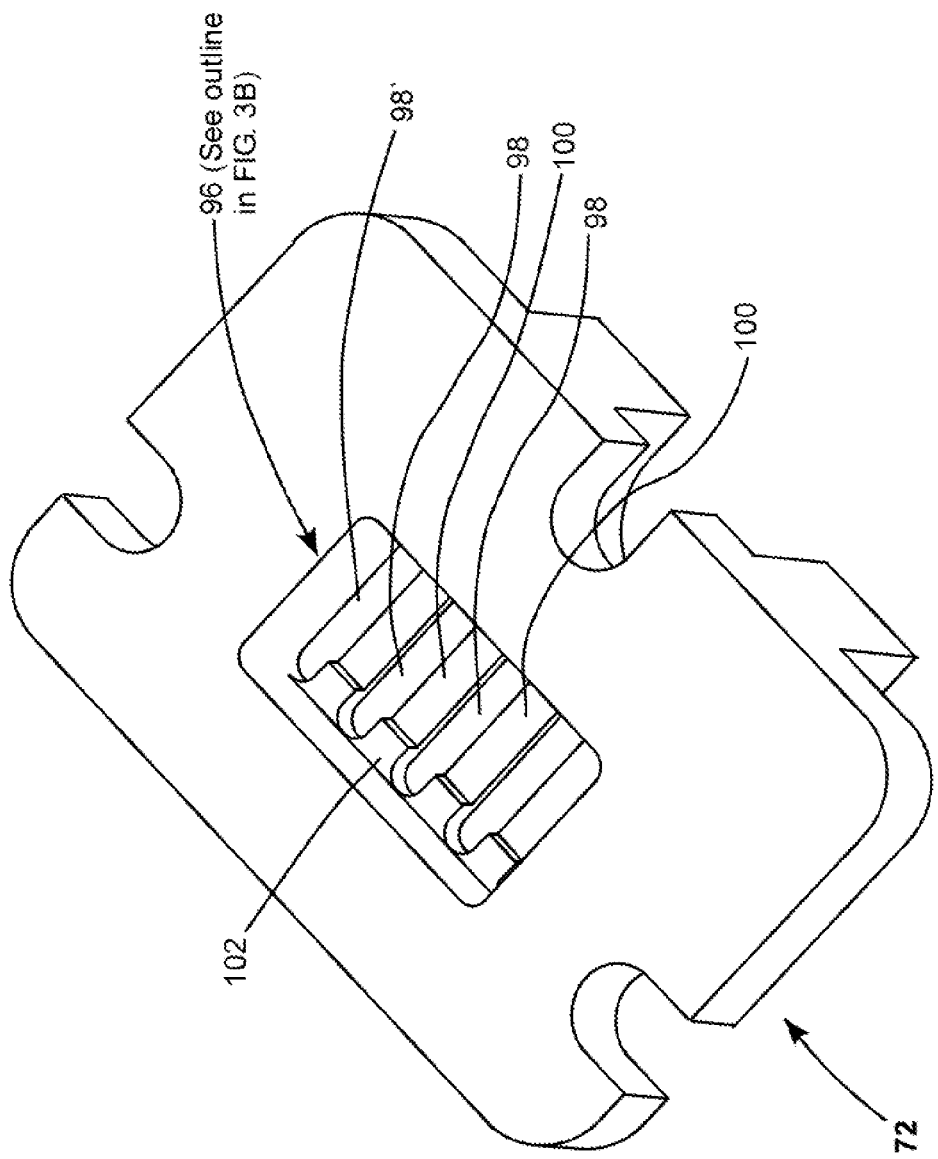
FIG. 3C is a three-dimensional view from below illustrating a recess formed in the cooling-unit of FIG. 3, the recess including spaced apart grooves which form the macro-cooling-channels when the cooling-unit is assembled on the base.

Details of cooling-arrangements for the inventive heat-sink are next described with reference to FIG. 3C, FIG. 3D and FIG. 3E. FIG. 3C is a three-dimensional view from below illustrating a recess 96 formed in cooling-unit 72. The recess includes spaced-apart grooves 98 which form macro-cooling-channels when cooling-unit 72 is assembled onto the base of the heat-sink. Ridges 100 separate grooves 98 (except for end ones 98' thereof). The grooves terminate in raised (less deep) portions 102 at each end of the groves (only one visible in FIG. 3C).

Regarding exemplary dimensions in FIG. 3C, the grooves (between portions 102) are preferably about 0.6 mm deep (as defined by the height or depth difference between the grooves and ridges 100). The grooves are preferably about 1.2 mm wide. The length of recess 96 including the grooves is preferably long enough to extend along most of the length of platform 73 of cooling-unit 72, and wide enough to extend partially under raised portion 75 of the cooling-unit, as can be seen in the phantom outline in FIG. 3B. The total depth of recess 96 (at the groves) is preferably selected such that grooves 98 are within about 0.3 mm of the surface of platform 73 (see FIG. 3B) of the cooling-unit.

Figure 3D:
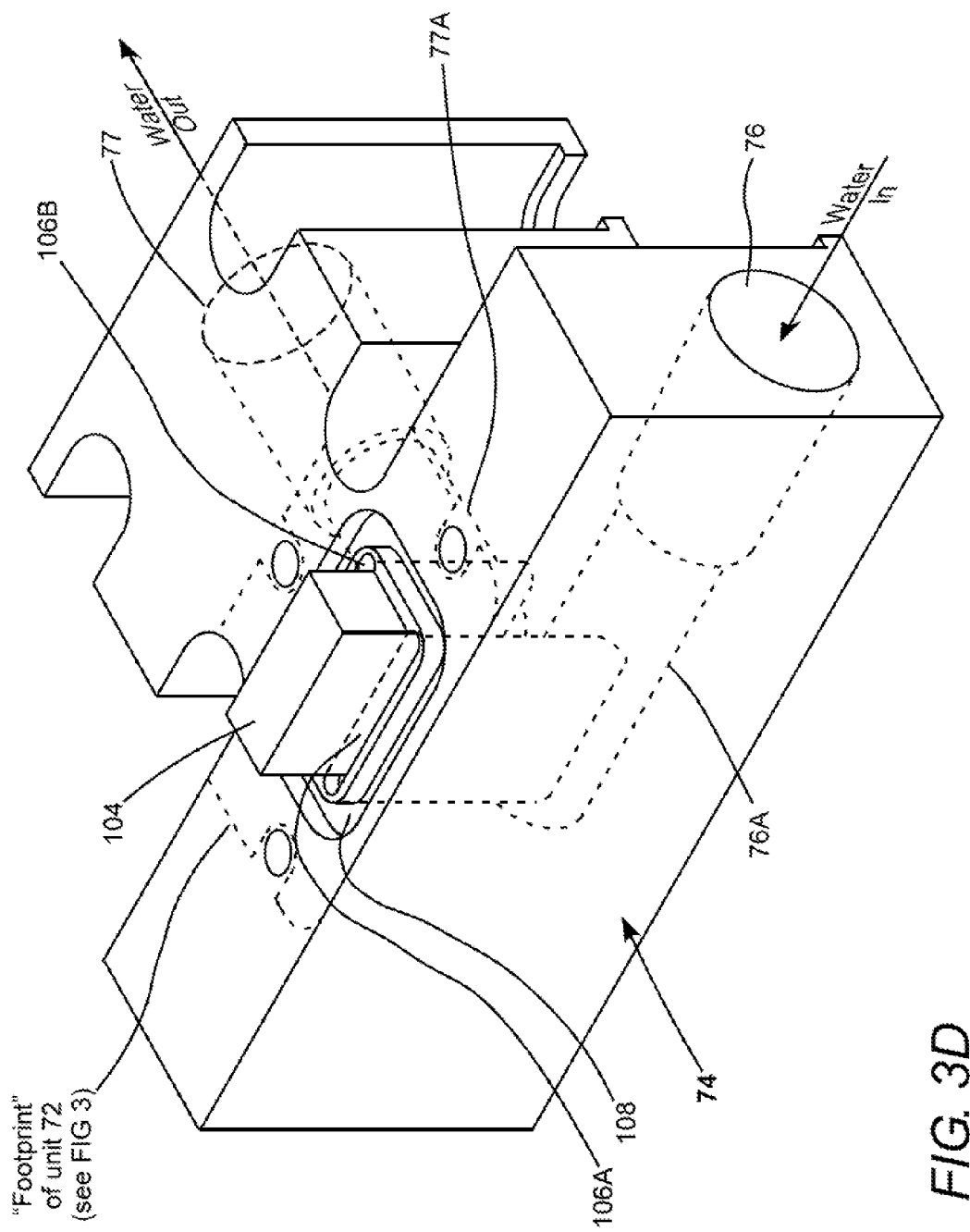
FIG. 3D is an enlarged three-dimensional view of the base of the heat-sink of FIG. 3 schematically illustrating a mating-block which inserts into the cooling-unit recess of FIG. 3C for closing the grooves to form the macro-channels, and illustrating a system of plenums and conduits for leading water to and from the macro-channels.

FIG. 3D is an enlarged three-dimensional view of the base 74 of the inventive heat-sink. A footprint of cooling-unit 72 is depicted in phantom. Water conduits within the base are also depicted in phantom. Continuing reference is made to FIG. 3C.

Base 74, here, is assumed to be machined from a single piece of metal such as stainless-steel. A mating-block portion 104 of the base is configured to engage raised portions 100 in recess 96 of FIG. 3C for closing grooves 98 to form macro-channels. In that regard, mating-block 104 is a close fit in the length of the recess and a close fit between raised portions 102 in the recess. On opposite sides of block 104 are machined elongated plenums 106A and 106 B. The block and plenums are surrounded by a machined groove 108 for accommodation a sealing ring.

Plenums correspond in position to raised (channel-terminating) portions 102 in recess 96 of FIG. 3C. Plenum 106A is in fluid communication with a straight portion 76A of inlet conduit 76. Plenum 106B is in fluid communication with a straight portion 77A of outlet conduit 77. The selection of conduit 76 for inlet, and conduit 77 for outlet, is somewhat arbitrary, and should not be considered as limiting the present invention.

Figure 3E:
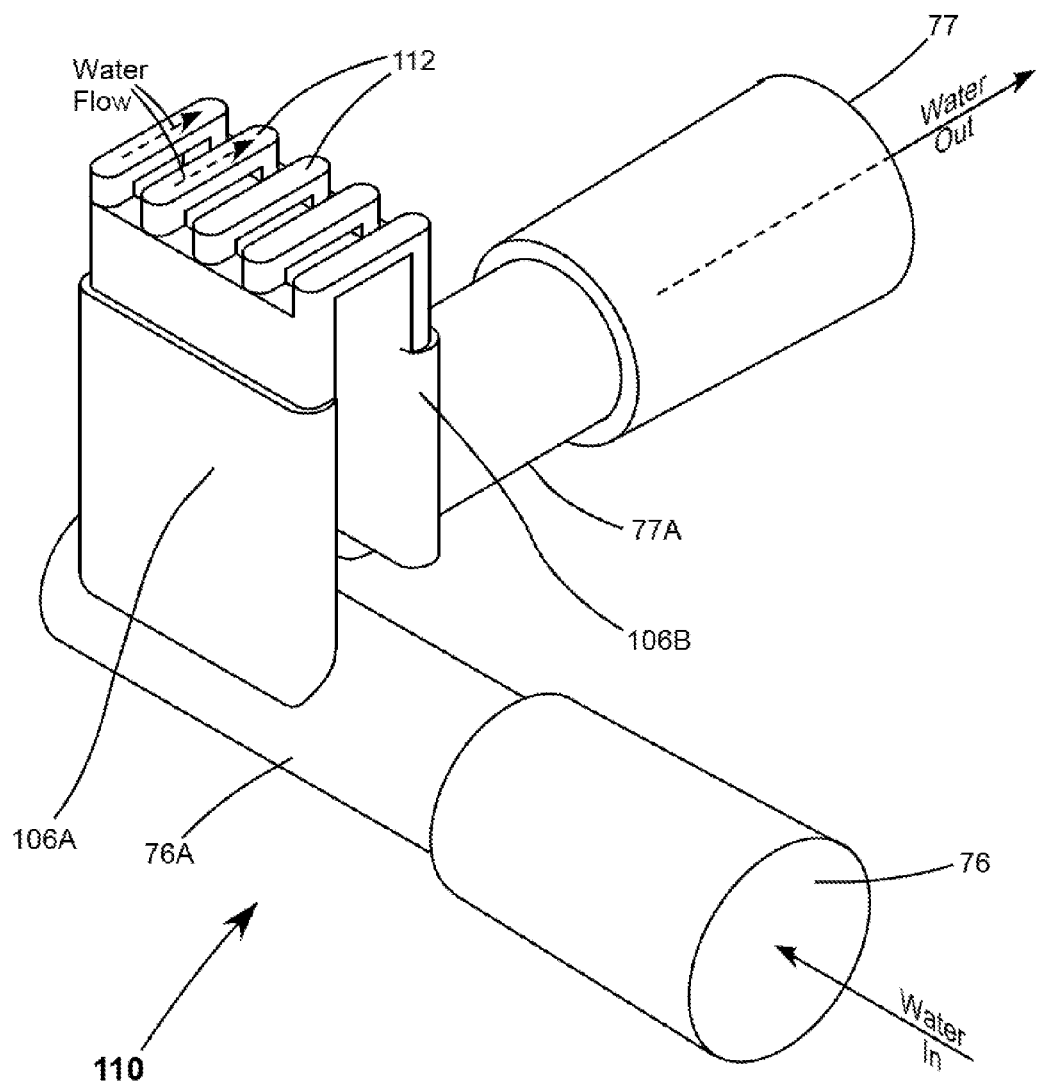
FIG. 3E is a hypothetical three-dimensional view of the system of conduits, plenums, and macro-channels of FIG. 3D, with surrounding parts of the base and cooling-unit removed to reveal details of the system.

FIG. 3E is a hypothetical three-dimensional view of the system (100) of conduits, plenums, and grooves of FIGS. 3C and 3D, with surrounding parts of the base and cooling-unit removed to reveal details of the system. Here it can be seen that the engagement of block 104 (in the base) of FIG. 3D with the recess (in the cooling-unit) of FIG. 3C, when the base and cooling-unit are assembled together, causes the grooves to become macro-channels (macro-conduits) 102, which link inlet and outlet plenums 106A and 106B, respectively, and corresponding inlet and outlet conduits 76 and 77 respectively. Flow though the macro-channels is as indicated.

The present invention is described above in terms of two embodiments. In one aspect of the invention a heat-sink includes a single-piece copper cooling-unit, and a single-piece base-unit, which, when assembled together, form macro-channels in the cooling-unit through which water can be circulated. The term "macro-channel" as used herein implies that the channel preferably has a minimum dimension not less than about 0.2 mm.

One embodiment of the inventive heat-sink is configured for mounting a fast-axis stack of diode-laser bars. The other is configured for mounting a single diode-laser bar, however, a slow-axis (horizontal) array of bars could utilize a plurality of these heat-sinks on a common platform. In either embodiment, the two-piece construction allows corrosion-resistant plating of the copper portions of the macro-channels before the heat-sink is assembled.

In another aspect of the invention, a diode-bar is solder-bonded between an overlapping region of two metallized, ceramic sub-mounts before being mounted on the cooling-unit of the heat-sink. Each of the ceramic sub-mounts is in thermal communication with the cooling-unit for cooling the diode-laser bar. Electrical connection is made to non-overlapping portions of the metallized ceramic sub-mounts for making electrical connection to the diode-laser bar. This arrangement has an advantage that the diode-laser bar, and electrical connections thereto, are electrically isolated from the cooling-unit and the cooling-water therein, for resisting corrosion of macro-channels in the cooling-unit by the water.

The arrangement also has an advantage that stresses induced in the diode-laser bar due to CTE mismatch between the material of the diode-laser bar and the ceramic are balanced out, minimizing slow-axis misalignment of emitters in the diode-laser bar and providing for increased reliability under temperature cycling. This latter advantage can be enjoyed even with heat-sink arrangements that are not water-cooled, i.e., passively or conductively cooled.

The present invention is not limited to the above-described embodiments. Rather the invention is limited only by the claims appended hereto.

What is claimed is:

1. Diode-laser apparatus, comprising:
   a heat-sink, the heat-sink comprising:
      a base,
      first and second cooling-members spaced apart, facing each other, and in thermal communication with the base, and
      first and second thermally conductive, electrically insulating, sub-mounts of a ceramic material, each thereof having first and second opposite surfaces; and
   a diode-laser bar assembly located between the first and second cooling-members, the diode-laser bar assembly including a diode-laser bar solder-bonded between the first surfaces of the first and second sub-mounts, with the second surfaces of the first and second sub-mounts in thermal communication with respectively the first and second cooling-members.

2. The apparatus of claim 1, wherein the first and second sub-mounts each have a length greater than the length of the diode-laser bar and are arranged partially overlapping, with the diode-laser between overlapped portions of the sub-mounts, and with a non-overlapped of the first sub-mount extending beyond one end of the diode-laser bar and a non-overlapped portion of the second sub-mount extending beyond an opposite end of the diode laser bar.

3. The apparatus of claim 2, wherein electrical connection to the diode-laser bar is made via the first surfaces of the non-overlapped portions of the first and second sub-mounts, whereby the diode laser bar is electrically isolated from the heat sink.

4. The apparatus of claim 1, wherein a gold/tin solder is used for the solder-bonding of the sub-mounts to the diode-laser bar.

5. The apparatus of claim 1, wherein the first and second cooling-members are copper cooling-members and the ceramic material of the sub-mounts is one of beryllium oxide and aluminum nitride.

6. The apparatus of claim 1, wherein the first-cooling-member is a physically integral, platform-portion of the heat-sink, water-cooled by flowing water through coolant-channels formed below the platform-portion of the heat-sink, and the diode-laser has an emission-direction about parallel to the platform-portion of the heat-sink.

7. The apparatus of claim 6 wherein the second cooling-member is a physically separate member, solder-bonded to the second surface of the second sub-mount.

8. The apparatus of claim 1, wherein the first and second cooling-members are physically integral portions of the heat-sink extending from the heat-sink and the diode-laser bar has an emission direction in the extension-direction of the cooling-members.

9. The apparatus of claim 8, wherein each of the first and second cooling-members is water-cooled by flowing water through a channel formed therein.

10. The apparatus of claim 9, wherein the first sub-mount is solder-bonded to the first cooling-member, and wherein there is a thermally conductive packing-material between the second sub-mount and the second cooling-member.

11. Diode-laser apparatus, comprising:
a heat-sink, the heat sink comprising:
a base,
a mounting platform on the base, and
first and second thermally conductive, electrically insulating, sub-mounts of a ceramic material, each thereof having first and second opposite surfaces; and
a diode-laser bar assembly mounted on the mounting-platform, the diode-laser bar assembly including a diode-laser bar having an emission direction parallel to the mounting platform and being solder-bonded between the first surfaces of the first and second sub-mounts, with the second surface of the first sub-mount solder-bonded to the mounting platform;
a cooling-block mounted on the second surface of the second sub-mount in thermal communication with the sub-mount and the base.

12. The apparatus of claim 11, wherein the mounting platform of the base is water-cooled by flowing water through cooling-channels formed in the base below the mounting-platform.

13. The apparatus of claim 12, wherein the first and second sub-mounts each have a length greater than the length of the diode-laser bar, and are arranged partially overlapping, with the diode-laser between overlapped portions of the sub-mounts, and with a non-overlapped of the first sub-mount extending beyond one end of the diode-laser bar and a non-overlapped portion of the second sub-mount extending beyond an opposite end of the diode laser bar, and wherein electrical connection to the diode-laser bar is made via the first surfaces of the non-overlapped portions of the first and second sub-mounts, whereby the diode laser bar is electrically isolated from the flowing-water in the cooling channels formed in the base.

14. The apparatus of claim 11, wherein a gold/tin solder is used for the solder-bonding of the sub-mounts to the diode-laser bar.

15. Diode-laser apparatus, comprising:
a heat-sink, the heat sink comprising:
a base,
first and second cooling-members extending from the base, the first and second cooling-members being spaced apart, facing each other, and in thermal communication with the base, and
first and second thermally conductive, electrically insulating, sub-mounts of a ceramic material, each thereof having first and second opposite surfaces; and
a diode-laser bar assembly located between the first and second cooling-members, the diode-laser bar assembly including a diode-laser bar having an emission direction in the direction of extension of the cooling members and being solder-bonded between the first surfaces of the first and second sub-mounts, with the second surfaces of the first and second sub-mounts in thermal communication with respectively the first and second cooling-members.

16. The apparatus of claim 15, wherein each of the cooling members is water-cooled by flowing water through a cooling-channel formed therein.

17. The apparatus of claim 16, wherein the first and second sub-mounts each have a length greater than the length of the diode-laser bar, and are arranged partially overlapping, with the diode-laser between overlapped portions of the sub-mounts, and with a non-overlapped of the first sub-mount extending beyond one end of the diode-laser bar and a non-overlapped portion of the second sub-mount extending beyond an opposite end of the diode laser bar, and wherein electrical connection to the diode-laser bar is made via the first surfaces of the non-overlapped portions of the first and second sub-mounts, whereby the diode laser bar is electrically isolated from the flowing water in the cooling channels of the cooling members.

18. The apparatus of claim 17, wherein a gold/tin solder is used for the solder-bonding of the sub-mounts to the diode-laser bar.

* * * * *